United States Patent
Tomita et al.

(10) Patent No.: US 6,365,553 B1
(45) Date of Patent: Apr. 2, 2002

(54) OXIDE SUPERCONDUCTOR HAVING EXCELLENT CRACK-RESISTANT PROPERTY AND PROCESS OF PRODUCING SAME

(75) Inventors: Masaru Tomita; Masato Murakami, both of Tokyo (JP)

(73) Assignees: International Superconductivity Technology Center; Railway Technical Research Institute, both of Tokyo (JP)

( * ) Notice: Subject to any disclaimer, the term of this patent is extended or adjusted under 35 U.S.C. 154(b) by 0 days.

(21) Appl. No.: 09/648,195

(22) Filed: Aug. 25, 2000

(30) Foreign Application Priority Data

Aug. 25, 1999 (JP) ............................................ 11-238477

(51) Int. Cl.⁷ ........................ H01B 12/00; H01L 39/12; C04B 35/653
(52) U.S. Cl. ....................... 505/124; 505/236; 505/450; 505/729; 505/785
(58) Field of Search ................................ 505/124, 236, 505/450, 785, 729

(56) References Cited

U.S. PATENT DOCUMENTS

| | | | | |
|---|---|---|---|---|
| 5,010,053 A | * | 4/1991 | Maroni ........................... | 505/1 |
| 5,470,821 A | * | 11/1995 | Wong et al. .................. | 505/236 |
| 5,508,257 A | * | 4/1996 | Sibata et al. ................. | 505/452 |
| 5,696,057 A | * | 12/1997 | McArdle ....................... | 505/1 |

FOREIGN PATENT DOCUMENTS

| | | |
|---|---|---|
| JP | 64-709 | 1/1989 |
| JP | 2-129812 | 5/1990 |

* cited by examiner

*Primary Examiner*—Mark Kopec
(74) *Attorney, Agent, or Firm*—Flynn, Thiel, Boutell & Tanis, P.C.

(57) ABSTRACT

The invention provides an oxide superconductor capable of sufficiently withstanding external forces such as a large electromagnetic force and thermal stresses accompanying rapid heating and cooling while in service, and internal stresses so as to be able to exhibit a high trapped magnetic field stably over a long period of time. The oxide superconductor such as, for example, "a copper oxide superconductor containing rare earth elements", is composed of an oxide superconductive bulk body impregnated with a low melting metal or an oxide superconductive bulk body impregnated with a low melting metal and having a thin film of the low melting metal formed on the external surface thereof. Such oxide superconductors as described above can be produced by a process whereby the oxide superconductive bulk body kept in an atmosphere of reduced pressure is brought into contact with the low melting metal. Further, if the oxide superconductive bulk body is provided with pores beforehand, so that contact faces thereof with the low melting metal in a molten state are both the external surface of the oxide superconductive bulk body and the inner surface of the respective pores, further improvements in production efficiency and product performance can be expected.

16 Claims, No Drawings

OXIDE SUPERCONDUCTOR HAVING EXCELLENT CRACK-RESISTANT PROPERTY AND PROCESS OF PRODUCING SAME

BACKGROUND OF THE INVENTION

1. Field of the Invention

The present invention relates to an oxide superconductor having an excellent crack-resistant property, capable of inhibiting occurrence of cracks due to internal or external force such as electromagnetic force, thermal stress, and so forth, and maintaining a high trapped magnetic field over a long period of time, and also to a process of producing the same.

The oxide superconductor according to the invention can be put to a wide variety of applications such as a magnetic levitation train, an energy storage system, and so forth, and is expected to play an important role in enhancement of performance of apparatuses such as those mentioned above.

2. Description of the Related Art

Since there have been found metal oxide superconducting materials having a relatively high critical temperature (Tc), such as $LiTi_2O_3$, $Ba(Bi, Pb)O_3$ and $(Ba, K)BiO_3$ in recent years, the research has been spurred more and there have successively been created copper oxide superconducting materials having a relatively high critical temperature (Tc) that had never been anticipated before, such as $(La, Sr)_2CuO_4$, $REBa_2CU_3O_7$ (RE is a rare earth element), $Bi_2Sr_2Ca_2Cu_3O10$, $TiBa_2Ca_2Cu_3O_{10}$ and $HgBa_2Ca_2Cu_3O_8$.

A superconducting material has a high critical current density as compared with an ordinary conducting material, and thus is capable of passing a large electric current without any loss. However it is known that in the case of passing such a large electric current, a material is sometimes destroyed depending upon its strength, since a large electromagnetic force acts on a superconductor in question.

Particularly, accompanying the enhanced characteristics and large scale operation of relatively high temperature bulk superconductors (particularly, copper oxide superconductors) prepared by a melting process, the magnitude of a magnetic field capable of being trapped in a bulk superconductor has recently been drastically enhanced, for instance, to the extent that a magnetic flux density exceeding 5 tesla (T) has come to be trapped. Since an electromagnetic force applied to a superconductor increases with an increase in a trapped magnetic field, there has recently been brought about such a situation in that a restriction is imposed on a trapped magnetic field depending upon a material's strength. Under such circumstances, importance is attached to the improvement in mechanical properties rather than a further improvement in superconducting properties.

Further, although it is necessary that the oxide superconductor is cooled to temperatures (at least less than the temperature of liquid nitrogen) to allow the foregoing oxide superconductor to exhibit intended characteristics, the thermal shock generated at that time in the case of oxide bulk superconducting materials becomes a major cause of the occurrence of cracks.

It being so, the following two proposals have been made as a means for reinforcing an oxide bulk superconductor prepared by a melting process.

One proposal includes a method of preparing an oxide bulk superconductor from a row material to which Ag is added. It is said that the oxide bulk superconductor obtained by this method exhibits an excellent strength (e.g., "Japanese Journal of Applied Physics" vol. 70, No. 9, 1991, pp. 4989 to 4994 and "Superconductor Science and Technology" 11, 1998, pp. 1345 to 1347).

The other proposal includes a method in which a compression strain is applied in advance to a bulk superconducting material by fitting the bulk superconducting material with a metallic ring at the outer periphery (refer to "Extended Abstract of ISTEC International Workshop" 1998, pp. 115 to 118). It is said that by taking this method, an improvement is brought about on the trapped magnetic field, since the tensile stress caused at the time of trapping the magnetic field is alleviated by the compression strain which was applied in advance, thereby suppressing the destruction of the material.

However, according to the method of reinforcing the superconductor by adding Ag, it is disadvantageous in cost, and it is impossible to dispel fears that the crack-prevention effect is not sufficient when the material is put to a use where a large force is applied to the material and also it was very difficult to restrain cracks from occurring when the material is used over a long period of time. to restrain cracks from occurring when the material is used over a long period of time.

Meanwhile, according to the above mentioned method of fitting the material with a metallic ring at the outer periphery, it takes unexpected labor for fitting the material with a metallic ring, and the surface of the material to be fitted with the metallic ring is restricted because it is difficult to cover the entire surface of the material with the metallic ring, and hence it was difficult to obtain a sufficient intended crack resistance or prevention effect.

The object of the invention, taking into consideration of the foregoing, is to establish a method for readily providing at a low cost, an oxide superconductor prepared by a melting process capable of sufficiently withstanding an external force or inner stress such as a large electromagnetic force or a thermal stress accompanying a sudden rise or drop in temperature at the time of use, and further, capable of exhibiting a high trapped magnetic field over a long period of time.

SUMMARY OF THE INVENTION

The inventors have conducted intensive studies in order to achieve the object described above, and as a result, the following novel information has been obtained.

(a) An oxide bulk superconductor prepared by a melting process is a ceramic in the state of a pseudo-single crystal, however, it is practically difficult to prevent microcracks and pores from being formed therein in a process of preparing the same. In particular, there is a tendency of microcracks and pores being formed in a subsurface layer thereof. formed in a subsurface layer thereof.

(b) When such an oxide bulk superconductor is subjected to "a large mechanical impact force, a large thermal impact force due to sudden change in temperature, a large electromagnetic force", and so forth, stress concentration occurs in the microcracks and the pores as described above, whereupon relatively large cracks which are propagated from the microcracks and the pores as starting points are developed.

(c) With an oxide bulk superconductor, once the relatively large cracks as described above are developed, this will inhibit flow of superconductive current, resulting in a large decrease in a trapped magnetic field value.

(d) However, when an oxide bulk superconductor is brought into contact with a low melting metal (low melting metal having a melting point at about 200° C. or lower, or at about 300° C. or lower) in molten state in an atmosphere of reduced pressure, this will cause the low melting metal to be smoothly permeated inside the oxide bulk superconductor through the microcracks and the pores formed in the surface thereof even if the oxide bulk superconductor is one produced by a melting method, having a high density of constituent material, thus resulting in occurrence of a phenomenon wherein the microcracks and the pores inside the oxide bulk superconductor are filled up with the low melting metal. With the oxide bulk superconductor having the microcracks and the pores formed therein, filled up with the low melting metal as described above, occurrence of stress concentration in regions of the microcracks and the pores is alleviated, and propagation of cracks starting from the microcracks and the pores can be inhibited, so that a situation where there occurs a large degradation in the trapped magnetic field can be avoided even if "a large mechanical impact force, a large thermal impact force due to sudden change in temperature, a large electromagnetic force", or so forth is applied thereto.

(e) In this case, even if impregnation with the low melting metal does not reach the center of the oxide bulk superconductor, staying in a layer very close to the surface thereof (within about several tenths mm), an effect of inhibiting propagation of cracks is significant, rendering it possible to maintain a sufficiently high trapped magnetic field over a long period of time.

(f) If the oxide bulk superconductor is exposed to a corrosive atmosphere containing much moisture and carbon dioxide over a long period of time, there arises a risk of the constituent material undergoing degradation due to corrosion or a reactive phase occurring, thereby causing new cracks to be developed and propagated. However, in the case that the oxide bulk superconductor with a thin film of the low melting metal, bonded to the external surface thereof, is solidified when applying the treatment of impregnation with the low melting metal, so that the oxide bulk superconductor is in a state wherein the surface thereof is covered with the thin film of the low melting metal, not only an effect of inhibiting propagation of cracks is by far enhanced by the agency of the low melting metal impregnated in the oxide bulk superconductor in combination with that of the thin film of the low melting metal covering the surface of the oxide bulk superconductor but also corrosion resistance of the surface is considerably improved. As a result, it is possible to inhibit propagation of cracks that otherwise occurs due to external force, internal stress, or corrosion when the oxide bulk superconductor is put to use, so that a sufficiently high trapped magnetic field can be maintained on a long term basis.

(g) Further, if the treatment of impregnation with a low melting metal is applied to an oxide bulk superconductor provided with pores beforehand, this will cause the low melting metal to be impregnated from both the external surface of the oxide bulk superconductor, and the inner surface of the pores, so that not only time required for the treatment of impregnation can be shortened but also the low melting metal can be easily impregnated to a greater depth inside the oxide bulk superconductor, thereby further enhancing durability of the effect of the treatment, sustaining its high performance.

(h) In addition, since there has been observed no degradation at all in superconductivity of an oxide bulk superconductor matrix due to impregnation with the low melting metal and formation of the thin film of the low melting metal on the surface of the oxide bulk superconductor, the above-described methods represent very beneficial means for improving mechanical properties and corrosion resistance of the oxide bulk superconductor while maintaining excellent superconductivity thereof.

The invention has been developed on the basis of items contained in the information described in the foregoing, and so forth, and an object of the invention is to provide an oxide superconductor as described below. It is another object of the invention to provide a process of producing the same.

1) An oxide superconductor having excellent crack-resistant property, composed of an oxide superconductive bulk body impregnated with a low melting metal, produced by a melting method.

2) An oxide superconductor having excellent crack-resistant property, composed of an oxide superconductive bulk body, impregnated with a low melting metal, and having a thin film of the low melting metal, formed on the external surface thereof, produced by a melting method.

3) An oxide superconductor having excellent crack-resistant property, as set forth in Item 1) or 2) above, wherein the oxide superconductive bulk body is a copper oxide superconductor containing at least one rare earth element selected from the group consisting of Y, La, Nd, Sm, Eu, Gd, Dy, Ho, Er, Tm, and Yb.

4) A process of producing an oxide superconductor having excellent crack-resistant property, as set forth in any of items 1 to 3 above, whereby the oxide superconductive bulk body kept in an atmosphere of reduced pressure is brought into contact with the low melting metal in a molten state.

5) A process of producing an oxide superconductor having excellent crack-resistant property, as set forth in item 4) above, whereby the oxide superconductive bulk body is provided with pores beforehand, so that both the external surface of the oxide superconductive bulk body and the inner surface of the respective pores are turned to contact faces of the oxide superconductive bulk body with the low melting metal in the molten state.

DETAILED DESCRIPTION OF THE PREFERRED EMBODIMENTS

An oxide superconductive bulk body to be adopted in carrying out the invention may be any of the hitherto known types thereof. However, it can be said that a copper oxide a superconductive bulk body such as an RE—Ba—Cu—O base superconductor (RE refers to at least one rare earth element selected from the group consisting of Y, La, Nd, Sm, Eu, Gd, Dy, Ho, Er, Tm, and Yb), known as a high temperature superconductor having a high trapped magnetic field is a preferable one.

It can further be said that a more preferable oxide superconductor is an oxide superconductor composed of an oxide superconductive bulk body among the above-described, comprising $REBa_2Cu_8O_y$ (RE refers to at least one rare earth element selected from the group consisting of Y, Dy, Ho, Er, Tm, and Yb), known as a constituent material having a higher trapped magnetic field, as a parent phase, and $RE_2BaCuO_5$(RE refers to at least one rare earth element selected from the group consisting of Y, Sm, Eu, Gd, Dy, Ho, Er, Tm, and Yb), as a dispersion phase contained in the parent phase at 50% or less thereof by volume, or an oxide superconductor composed of an oxide superconductive bulk body comprising $RE_{1+x}Ba_{2-x}Cu_3O_y$ (RE refers to at least one rare earth element selected from the group consisting of La, Nd, Sm, Eu, and Gd while variables x, y are preferably in the range of $-0.1<x<0.2$, and $6.5<y<7.2$) as a parent phase, and a $RE_{4-2x}Ba_{2+2x}Cu_{2-x}O_{10-2x}$ (RE refers to at least one rare earth element selected from the group consisting of La and Nd while a variables x is preferably in the range of −0.2<x<0.3) phase or a $RE_2BaCuO_5$ (RE refers to at least one rare earth element selected from the group consisting of Sm, Eu, and Gd) phase as a dispersion phase contained in the parent phase at 50% or less thereof by volume.

Further, when an oxide superconductive bulk body is heated to a certain temperature or higher in the atmosphere, binding oxygen contained therein will be scattered and lost, so that the oxide superconductive bulk body will come to fail to exhibit superconductivity. Accordingly, for "a low melting metal" to be impregnated into the oxide superconductive bulk body, it is necessary to use a metal or an alloy having a melting point lower than "a temperature causing oxygen to be scattered and lost".

The "temperature causing oxygen to be scattered and lost" is in the order to 300° C. for a Y—Ba—C—O superconductive bulk body, 250° C. for a Gd—Ba—Cu—O superconductive bulk body, and 200° C. for a Sm—Ba—Cu—O superconductive bulk body or a Nd—Ba—Cu—O superconductive bulk body. Accordingly, a low melting metal having a melting point at not higher than 200° C. can be applied to any kind of oxide superconductive bulk body.

In this connection, specific examples of a low melting metal applicable to the present invention, and the melt-starting temperature thereof are shown thereunder.
(a) alloy of 44.7 wt. % Bi-22.6 wt. % Pb-8.3 wt. % Sn-5.3 wt. % Cd-19.1 wt. % In (melt-starting temperature: 46.7° C.)
(b) alloy of 42.34 wt. % Bi-22.86 wt. % Pb-11.0 wt. % Sn-8.46 wt. % Cd-15.34 wt. % In (melt-starting temperature: 47.0° C.)
(c) alloy of 49.4 wt. % Bi-18.0 wt. % Pb-11.6 wt. % Sn-21.0 wt. % In (melt-starting temperature: 58.0° C.)
(d) alloy of 48.0 wt. % Bi-25.6 wt. % Pb-12.8 wt. % Sn-9.6 wt. % Cd-4.0 wt. % In (melt-starting temperature: 61.0° C.)
(e) alloy of 50.0 wt. % Bi-25.0 wt. % Pb-12.5 wt. % Sn-12.5 wt. % Cd (melt-starting temperature: 60.0° C.)
(f) alloy of 50.0 wt. % Bi-26.7 wt. % Pb-13.3 wt. % Sn-10.0 wt. % Cd (melt-starting temperature: 70.0° C.)
(g) alloy of 40.0 wt. % Bi-40.0 wt. % Pb-11.5 wt. % Sn-10.0 wt. % Cd (melt-starting temperature: 70.0° C.)
(h) alloy of 57.0 wt. % Bi-17.0 wt. % Sn-26.0 wt. % In (melt-starting temperature: 78.8° C.)
(i) alloy of 51.65 wt. % Bi-40.2 wt. % Pb-8.15 wt. % Cd (melt-starting temperature: 91.5° C.)
(j) alloy of 52.5 wt. % Bi-32.0 wt. % Pb-15.5 wt. % Sn (melt-starting temperature: 95.0° C.)
(k) alloy of 52.5 wt. % Bi-32.0 wt. % Pb-15.5 wt. % Sn (melt-starting temperature: 95.0° C.)
(l) alloy of 50.0 wt. % Bi-28.0 wt. % Pb-22.0 wt. % Sn (melt-starting temperature: 100° C.)
(m) alloy of 53.9 wt. % Bi-25.9 wt. % Sn-20.2 wt. % Cd (melt-starting temperature: 102.5° C.)
(n) alloy of 55.5 wt. % Bi-44.5 wt. % Pb (melt-starting temperature: 124° C.)
(o) alloy of 58.0 wt. % Bi-42.0 wt. % Sn (melt-starting temperature: 138° C.)
(p) alloy of 40.0 wt. % Bi-60.0 wt. % Sn (melt-starting temperature: 138° C.)
(q) alloy of 50.0 wt. % Bi-27.5 wt. % Pb-13.5 wt. % Sn-9.0 wt. % Sb (melt-starting temperature: 148° C.)
(r) Bi (melt-starting temperature: 271.3° C.)
(s) In (melt-starting temperature: 156.2° C.)
(t) Sn (melt-starting temperature: 231.9° C.)

Now, inclusion of Ag in the oxide superconductive bulk body, as necessary, based on the previously-described conventional information is advantageous in further enhancing strength, and effective in maintaining a high trapped magnetic field. However, if Ag content exceeds 40% by weight, there will appear a tendency of superconductivity undergoing degradation. Accordingly, in the case of Ag being included in the oxide superconductive bulk body, Ag content is preferably held down to 40% or less by weight.

A method whereby an oxide superconductive bulk body kept in an atmosphere of reduced pressure such as in a vacuum is brought into contact with a low melting metal in a molten liquid state is preferred as means of impregnating the oxide superconductive bulk body with the low melting metal by use of a melting method. However, other methods such as "a pressurized impregnation method" may be used as well.

When the oxide superconductive bulk body kept in an atmosphere of reduced pressure or a pressurized atmosphere is brought into contact with the low melting metal in a molten state by use of the melting method, the low melting metal is permeated into the bulk body through the microcracks and the pores, having openings in the surface of the bulk body, thereby filling up the microcracks and the pores (particularly, those in the subsurface layer). As a result, occurrence of stress concentration in the regions of the microcracks and the pores can be alleviated, and propagation of cracks occurring to the oxide superconductive bulk body, starting from these regions, can be inhibited. Accordingly, even in the case where the oxide superconductive bulk body is subjected to "a large mechanical impact force, a large thermal impact force due to sudden change in temperature, a large electromagnetic force", and so forth, a significant decline in the trapped magnetic field will not occur.

It should be added that impregnation of the low melting metal into the oxide superconductive bulk body does not occur, and the effect of maintaining a high trapped magnetic field can not be attained by use of means whereby the oxide superconductive bulk body is simply brought into contact with the low melting metal without the use of the method of impregnation in an atmosphere of reduced pressure or the pressurized impregnation method.

Further, if the oxide bulk superconductor with a thin film of the low melting metal, bonded to the external surface thereof, is solidified when applying the treatment of impregnation with the low melting metal, it is possible to obtain an oxide superconductive bulk body in a state wherein the low melting metal is impregnated internally, and the surface thereof is covered with the thin film (e.g., in the order of not less than several tenths mm) of the low melting metal. With such an oxide superconductive bulk body, not only an effect of inhibiting propagation of cracks is by far enhanced by the agency of the low melting metal impregnated in the bulk body in combination with that of the thin film of the low melting metal covering the surface of the bulk body but also corrosion resistance of the surface is considerably improved. As a result, it is possible to inhibit propagation of cracks that otherwise occurs due to external force, internal stress, or corrosion when the oxide superconductive bulk body is put to use, so that a sufficiently high trapped magnetic field can be maintained on a long term basis.

As described hereinbefore, the invention provides an oxide superconductor with ease and at a low cost, having mechanical properties capable of sufficiently withstanding large thermal stresses accompanying heating/cooling, a large electromagnetic force, and so forth, and also having sufficient corrosion resistance, so as to be able to maintain high trapped magnetic field characteristics over a long time period. Accordingly, the invention can render itself a highly useful technique in the case of, for example, putting the oxide superconductive bulk body to an application under a high electromagnetic force or utilizing the oxide superconductive bulk body as a high-temperature superconductive magnet by causing it to trap a magnetic field.

Now, examples representing preferred embodiments of the invention are described in detail hereinafter.

EXAMPLE 1

There were prepared five kinds of bulk materials comprising $YBa_2Cu_3O_y$ as a superconductor and a $Y_2BaCuO_5$ phase dispersed therein in an amount of 0, 10, 20, 30, and 40% of the former by volume, respectively, by means of the melt-texture-growth (MTG) process.

There were adopted the normal conditions of the MTG process, under which respective starting materials $YBa_2Cu_3O_y$ were heated to 1100° C. for 20 minutes, subsequently cooled to 1050° C. in 30 minutes, and after placing a SmBa2 Cu3Oy phase therein as a seed crystal, were further cooled down to 900° C. at a cooling rate of 0.5° C./hr.

After crystal growth, specimens thereof were annealed with oxygen at 400° C. for 250 hrs. in a stream of oxygen at 1 atmospheric pressure.

Subsequently, "a group not impregnated with a low melting metal" and "a group having a subsurface region impregnated with a low melting metal after placed in a vacuum vessel" were prepared, respectively, from respective superconductive bulk bodies thus obtained.

In applying a treatment for impregnation with the low melting metal, the respective superconductive bulk bodies were first heated to 130° C. in the vacuum vessel while reducing pressure inside the vacuum vessel to 1 Torr, and subsequently, a 55.5 wt. % Bi-44.5 wt. % Pb alloy (melting point: 124° C.), which is in a molten condition when heated to 130° C., is injected into the respective bulk bodies under reduced pressure to be thereby permeated therethrough. Thereafter, pressure inside the vacuum vessel was increased to atmospheric pressure while lowering the temperature of the respective bulk bodies to room temperature.

Subsequently, respective superconductors thus obtained were cooled to 77 K, and after applying thereto a magnetic field with 10T at the temperature described, the temperature was lowered to 50 K. Then, the magnetic field was gradually reduced to be finally removed, whereupon measurements were taken of magnetic field distribution on the surface of the respective superconductors by use of a Hall device.

As a result, it was confirmed that all specimens of the respective superconductors belonging in the group not impregnated with a low melting metal were found destroyed.

On the other hand, a trapped magnetic field of specimens of respective superconductors to which the treatment for impregnation with the low melting metal was applied (confirmed that impregnation of the low melting metal has reached a depth of about 1 mm from the external surface of the specimens) showed 2.5T, 3T, 4T, 4T, and 3T, respectively, with respect to the specimens having Y211 phase content at 0, 10, 20, 30, and 40% by volume, respectively.

Further, with the specimens to which the treatment for impregnation with the low melting metal was applied, a process of "removing a magnetic field after cooling the respective bulk bodies down to 77 K rapidly while applying a magnetic field with 10T thereto" was repeated ten times, however, the trapped magnetic fields in respective processes indicated identical values, showing no sign of degradation in performance.

Needless to say, difference in value between the trapped magnetic fields due to difference in the Y211 phase content reflects difference in critical current density as caused by the difference in the Y211 phase content.

EXAMPLE 2

There were prepared five kinds of bulk materials comprising $Sm_{0.9}Ba_{2.1}Cu_3O_y$ as a superconductor and a $Sm_2BaCuO_5$ phase (Sm211 phase) dispersed therein in an amount of 0, 10, 20, 30, and 40% of the former by volume, respectively, by means of the oxygen-controller-melt-growth (OCMG) process.

There were adopted the normal conditions of the OCMG process, under which respective starting materials $Sm_{0.9}Ba_{2.1}Cu_3O_y$ were heated to 1200° C. for 20 minutes in "an atmosphere of a flowing mixed gas of argon and oxygen, with an oxygen partial pressure kept at 1%", subsequently cooled to 1050° C. in 20 minutes, and after placing a $NdBa_2Cu_3O_y$ phase therein as a seed crystal, were further cooled down to 900° C. at a cooling rate of 0.5° C./hr.

Subsequently, respective superconductive bulk bodies thus obtained were annealed with oxygen at 350° C. for 200 hrs. in a stream of oxygen at 1 atmospheric pressure.

Subsequently, "a group not impregnated with a low melting metal" and "a group having a subsurface region impregnated with a low melting metal after placed in a vacuum vessel" were prepared, respectively, from the respective superconductive bulk bodies described above.

In applying a treatment for impregnation with the low melting metal, the respective superconductive bulk bodies were first heated to 130° C. in the vacuum vessel while reducing pressure inside the vacuum vessel to 1 Torr, and subsequently, a 55.5 wt. % Bi-44.5 wt. % Pb alloy (melting point: 124° C.), which was melted by heating to 130° C., is injected into the respective bulk bodies under a reduced pressure to be thereby permeated therethrough. Thereafter, pressure inside the vacuum vessel was increased to atmospheric pressure while lowering the temperature of the respective bulk bodies to room temperature.

Subsequently, respective superconductors thus obtained were cooled to 77 K, and after applying thereto a magnetic field with 10T at the temperature described, the temperature was lowered to 50 K Then, the magnetic field was gradually reduced to be finally removed, whereupon measurements were taken of magnetic field distribution on the surface of the respective superconductors by use of a Hall device.

As a result, it was confirmed that all specimens of the respective superconductors belonging in the group not impregnated with a low melting metal were found destroyed.

On the other hand, trapped magnetic fields of specimens of the respective superconductors to which the treatment for impregnation with the low melting metal was applied (confirmed that impregnation of the low melting metal has reached a depth of about 1 mm from the external surface of the specimens) showed 8T, and 6.5T, respectively, with respect to the specimens having Sm211 phase content at 30, and 40% by volume, respectively.

Further, with the specimens to which the treatment for impregnation with the low melting metal was applied, the process of "removing a magnetic field after cooling the respective bulk bodies down to 77 K rapidly while applying a magnetic field with 10T thereto" was repeated ten times, however, the trapped magnetic fields in respective processes indicated identical values, showing no sign of degradation in performance.

EXAMPLE 3

There were prepared three kinds of bulk materials comprising $Nd_{0.9}Ba_{2.1}Cu_3O_y$ as a superconductor and a $Nd_{3.6}Ba_{2.4}Cu_{1.8}O_z$ phase (Nd422 phase) dispersed therein in an amount of 20, 30, and 40% of the former by volume, respectively, by means of the OCMG process.

There were adopted the normal conditions of the OCMG process, under which respective starting materials $Nd_{0.9}Ba_{2.1}Cu_3O_y$ were heated to 1040° C. for 20 minutes in "an atmosphere of a flowing mixed gas of argon and oxygen, with an oxygen partial pressure kept at 1%", subsequently cooled to 1010° C. in 20 minutes, and after placing monocrystalline MgO therein as a seed crystal, were further cooled down to 900° C. at a cooling rate of 0.5° C./hr.

Subsequently, respective superconductive bulk bodies thus obtained were annealed with oxygen at 300° C. for 300 hrs. in stream of oxygen at 1 atmospheric pressure.

Subsequently, "a group not impregnated with a low melting metal" and "a group having a subsurface region impregnated with a low melting metal after placed in a vacuum vessel" were prepared from the respective superconductive bulk bodies described above, respectively.

In a treatment for impregnation with the low melting metal, the respective superconductive bulk bodies were first heated to 130° C. in the vacuum vessel while reducing pressure inside the vacuum vessel to $1 \times 10^{-1}$ Torr, and subsequently, a 55.5 wt. % Bi-44.5 wt. % Pb alloy (melting point: 124° C.), which is melt by heating to 130° C., is injected into the respective bulk bodies under reduced pressure to be thereby permeated therethrough. Thereafter, pressure inside the vacuum vessel was increased to atmospheric pressure while lowering the temperature of the bulk bodies to room temperature.

Subsequently, respective superconductors thus obtained were cooled to 77 K, and after applying thereto a magnetic field of 10T at the temperature described, the temperature was lowered to 50 K. Then, the magnetic field was gradually reduced to be finally removed, whereupon measurements were taken of magnetic field distribution on the surface of the respective superconductors by use of a Hall device.

As a result, it was confirmed that all specimens of the respective superconductors belonging in the group not impregnated with a low melting metal were found destroyed.

On the other hand, trapped magnetic fields of specimens of the respective superconductors to which the treatment for impregnation with the low melting metal was applied (confirmed that impregnation of the low melting metal has reached a depth of about 1 mm from the external surface of the specimens) showed 3T, 6.5T, and 5T, respectively, with respect to the specimens having Nd422 phase content at 20, 30, and 40% by volume, respectively.

Further, with the specimens to which the treatment for impregnation with the low melting metal was applied, the process of "removing a magnetic field after cooling the respective bulk bodies down to 77 K rapidly while applying a magnetic field with 10T thereto" was repeated ten times, however, the trapped magnetic fields in respective processes indicated identical values, showing no sign of degradation in performance.

EXAMPLE 4

There were prepared specimens of bulk materials comprising $YBa_2Cu_3O_y$ as a superconductor and a $Y_2BaCuO_5$ phase dispersed therein in an amount of 20, 30, and 40% of a the former by volume, respectively, further containing 10 wt. % of Ag, by means of the MTG process.

There were adopted the normal conditions of the MTG process, under which respective starting materials $YBa_2Cu_3O_y$ were heated to 1050° C. for 20 minutes, subsequently cooled to 1000° C. in 30 minutes, and after placing the $Y_2BaCuO_5$ phase as a seed crystal, were further cooled down to 900° C. at a cooling rate of 0.5° C./hr.

After crystal growth, the specimens were annealed with oxygen at 400° C. for 250 hrs. in a stream of oxygen at 1 atmospheric pressure.

Subsequently, "a group not impregnated with a low melting metal" and "a group having a subsurface region impregnated with a low melting metal after placed in a vacuum vessel" were prepared from respective superconductive bulk bodies thus obtained.

In a treatment for impregnation with the low melting metal, the respective superconductive bulk bodies were first heated to 240° C. in the vacuum vessel while reducing pressure inside the vacuum vessel to $5 \times 10^{-1}$ Torr, and subsequently, Sn metal (melting point: 231.9° C.), which is melt by heating to 240° C., is injected into the respective bulk bodies under reduced pressure to be thereby permeated therethrough. Thereafter, pressure inside the vacuum vessel was increased to atmospheric pressure while lowering the temperature of the respective bulk bodies to room temperature.

Subsequently, respective superconductors thus obtained were cooled to 77 K, and after applying thereto a magnetic field with 10T at the temperature described, the temperature was lowered to 50 K. Then, the magnetic field was gradually lowered to be finally removed, whereupon measurements were taken of magnetic field distribution on the surface of the respective superconductors by use of a Hall device.

As a result, trapped magnetic fields of the specimens to which the treatment for impregnation with the low melting metal was not applied showed 1.5T, 3T, and 2T, respectively, with respect to the specimens having Y211 phase content at 20, 30, and 40% by volume, respectively.

On the other hand, trapped magnetic fields of the specimens to which the treatment for impregnation with the low melting metal was applied (confirmed that impregnation of the low melting metal has reached a depth of about 1 mm from the external surface of the specimens) showed 4.5T, 5T, and 3T, respectively, with respect to the specimens having the Y211 phase content at 20, 30, and 40% by volume, respectively.

Further, with the specimens to which the treatment for impregnation with the low melting metal was applied, the process of "removing a magnetic field after cooling the respective bulk bodies down to 77 K rapidly while applying a magnetic field with 10T thereto" was repeated ten times, however, the trapped magnetic fields in respective processes indicated identical values, showing no sign of degradation in performance.

EXAMPLE 5

There were prepared three kinds of bulk materials comprising $Nd_{0.9}Ba_{2.1}Cu_3O_y$ as a superconductor and a $Nd_{3.6}Ba_{2.4}Cu_{1.8}O_z$ phase (Nd422 phase) dispersed therein in an amount of 20, 30, and 40% of the former by volume, respectively, by means of the OCMG process.

There were adopted the normal conditions of the OCMG process, under which respective starting materials $Nd_{0.9}Ba_{2.1}Cu_3O_y$ were heated to 1040° C. for 20 minutes in "an atmosphere of a flowing mixed gas of argon and oxygen, with a oxygen partial pressure kept at 1%", subsequently cooled to 1010° C. in 20 minutes, and after placing monocrystalline MgO therein as a seed crystal, were further cooled down to 900° C. at a cooling rate of 0.5° C./hr.

Subsequently, respective superconductive bulk bodies thus obtained were annealed with oxygen at 300° C. for 300 hrs. in a stream of oxygen at 1 atmospheric pressure.

Thereafter, a treatment for impregnation of a low melting metal as well as surface coating with the low melting metal was applied to the respective superconductive bulk bodies described above.

In the treatment for impregnation of the low melting metal as well as surface coating with the low melting metal, the respective superconductive bulk bodies were first heated to 130° C. in a vacuum vessel while reducing pressure inside the vacuum vessel to $1 \times 10^{-1}$ Torr, and subsequently, a 55.5 wt. % Bi-44.5 wt. % Pb alloy (melting point: 124° C.), which is melt by heating to 130° C. in the condition described above, is injected into the respective bulk bodies under reduced pressure thereby to be permeated therethrough and to be bonded onto the surface thereof. Thereafter, keeping such a condition as above as it is, pressure inside the vacuum vessel was increased to atmospheric pressure while lowering the temperature of the respective bulk bodies to room temperature.

Subsequently, respective superconductors thus obtained were cooled to 77 K, and after applying thereto a magnetic field with 10T at the temperature described, the temperature was reduced to 50 K. Then, the magnetic field was gradually reduced to be finally removed, whereupon measurements were taken of magnetic field distribution on the surface of the respective superconductors by use of a Hall device.

Trapped magnetic fields of specimens of the respective superconductors to which the treatment for impregnation of the low melting metal as well as surface coating with the low melting metal was applied (confirmed that impregnation of the low melting metal has reached a depth of about 1 mm from the external surface of the specimens, and the surface thereof was coated with a thin film of the low melting metal, 0.5 mm thick) showed 3T, 6.5T, and 5T, respectively, with respect to the specimens having Nd422 phase content at 20, 30, and 40% by volume, respectively.

Further, with the specimens to which the treatment for impregnation of the low melting metal as well as surface coating with the low melting metal was applied, the process of "removing a magnetic field after cooling the respective bulk bodies down to 77 K rapidly while applying a magnetic field of 10T thereto" was repeated ten times, however, the trapped magnetic fields in respective processes indicated identical values, showing no sign of degradation in performance.

It has been further confirmed that corrosion does not occur over a long period of time in an atmosphere wherein the superconductive bulk bodies are used, and degradation in performance due to corrosion does not occur either.

Now, the examples shown hereinabove are limited to cases represented by the specimens of copper oxide superconductors of Y, Sm, and Nd bases, impregnated with various low melting metals, respectively. It has been confirmed however that excellent advantageous effects similar to those for the examples described in the foregoing can also be exhibited by oxide superconductive bulk bodies of other La, Eu, Gd,Dy, Ho, Er, Tm, and Yb bases, respectively, or of a composite system containing a plurality of rare earth elements described above, impregnated with various low melting metals, respectively.

As described in the foregoing, the invention can provide an oxide superconductor with ease and at a low cost not only having improved superconductivity for ensuring a high trapped magnetic field but also causing no degradation of the trapped magnetic field in cases of temperature hysteresis after cooling and heating, electromagnetic hysteresis after electromagnetic force is applied repeatedly, or application thereof in a corrosive environment over a long period of time, thereby bringing about highly beneficial effects from an industrial point of view.

What is claimed is:

1. An oxide superconductor having excellent crack-resistant properties and comprising a pseudo-single crystal oxide superconductive bulk body impregnated with a metal or an alloy having a melting point no greater than about 300° C., the superconductive bulk body being produced by a melting process.

2. The oxide superconductor of claim 1, wherein the melting point is no greater than about 250° C.

3. The oxide superconductor of claim 1, wherein the melting point is no greater than about 200° C.

4. The oxide superconductor of claim 1, wherein said bulk body is impregnated with an alloy.

5. The oxide superconductor of claim 4, wherein said alloy is a Bi—Pb alloy.

6. The oxide superconductor of claim 5, wherein said alloy consists of 55.5 wt. % Bi and 44.5 wt. % Pb.

7. An oxide superconductor having excellent crack-resistant property according to claim 1, wherein the oxide superconductive bulk body is a copper oxide superconductor containing at least one rare earth element selected from the group consisting of Y, La, Nd, Sm, Eu, Gd, Dy, Ho, Er, Tm, and Yb.

8. A process of producing an oxide superconductor having excellent crack-resistant property, as set forth in claim 1, whereby the oxide superconductive bulk body kept in an atmosphere of reduced pressure is brought into contact with the metal one metal alloy in a molten state.

9. A process of producing an oxide superconductor having excellent crack-resistant property according to claim 8, whereby the oxide superconductive bulk body is provided with pores beforehand, so that both the external surface of the oxide superconductive bulk body and the inner surface of the respective pores are turned to contact faces of the oxide superconductive bulk body with the low melting metal in the molten state.

10. An oxide superconductor having excellent crack-resistant properties and comprising a pseudo-single crystal oxide superconductive bulk body impregnated with a metal or an alloy having a melting point of no greater than about 300° C., a film of the metal or alloy being formed on an external surface of the superconductive bulk body and the superconductive bulk body being produced by a melting process.

11. The oxide superconductor of claim 10, wherein the melting point is no greater than about 250° C.

12. The oxide superconductor of claim 10, wherein the melting point is no greater than about 200° C.

13. The oxide superconductor of claim 10, wherein said bulk body is impregnated with an alloy.

14. The oxide superconductor of claim 13, wherein said alloy is a Bi—Pb alloy.

15. The oxide superconductor of claim 14, wherein said alloy consists of 55.5 wt. % Bi and 44.5 wt. % Pb.

16. The oxide superconductor of claim 10, wherein the oxide superconductive bulk body is a copper oxide superconductor containing at least one rare earth element selected from the group consisting of Y, La, Nd, Sm, Eu, Gd, Dy, Ho, Er, Tm and Yb.

* * * * *